(12) United States Patent
Curatola et al.

(10) Patent No.: US 9,397,208 B2
(45) Date of Patent: Jul. 19, 2016

(54) COMPOUND SEMICONDUCTOR DEVICE

(71) Applicant: Infineon Technologies Austria AG, Villach (AT)

(72) Inventors: Gilberto Curatola, Villach (AT); Oliver Haeberlen, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/887,745

(22) Filed: Oct. 20, 2015

(65) Prior Publication Data

US 2016/0043210 A1 Feb. 11, 2016

Related U.S. Application Data

(60) Continuation of application No. 14/679,544, filed on Apr. 6, 2015, now Pat. No. 9,196,693, which is a division of application No. 13/331,970, filed on Dec. 20, 2011, now Pat. No. 9,024,356.

(51) Int. Cl.
| | |
|---|---|
| *H01L 29/205* | (2006.01) |
| *H01L 29/778* | (2006.01) |
| *H01L 29/40* | (2006.01) |
| *H01L 29/417* | (2006.01) |

(Continued)

(52) U.S. Cl.
CPC ........ *H01L 29/7787* (2013.01); *H01L 29/0692* (2013.01); *H01L 29/2003* (2013.01); *H01L 29/205* (2013.01); *H01L 29/401* (2013.01); *H01L 29/402* (2013.01); *H01L 29/404* (2013.01); *H01L 29/407* (2013.01); *H01L 29/41725* (2013.01); *H01L 29/42316* (2013.01); *H01L 29/66431* (2013.01); *H01L 29/66462* (2013.01); *H01L 2924/0002* (2013.01)

(58) Field of Classification Search
CPC ... H01L 29/407; H01L 29/404; H01L 29/402; H01L 29/7787; H01L 29/1066; H01L 29/66462; H01L 29/42316; H01L 29/778
USPC ............... 257/194, 24, 76; 438/507, 572, 172
See application file for complete search history.

(56) References Cited

U.S. PATENT DOCUMENTS

| | | | |
|---|---|---|---|
| 7,211,839 B2 | 5/2007 | Kachi et al. | |
| 2006/0065912 A1 | 3/2006 | Beach | |

(Continued)

FOREIGN PATENT DOCUMENTS

| | | |
|---|---|---|
| CN | 101410985 A | 4/2009 |
| JP | 62291181 S | 12/1987 |

(Continued)

*Primary Examiner* — Kenneth Parker
*Assistant Examiner* — Bo Fan
(74) *Attorney, Agent, or Firm* — Murphy, Bilak & Homiller, PLLC

(57) ABSTRACT

A semiconductor device includes a first compound semiconductor material and a second compound semiconductor material on the first compound semiconductor material. The second compound semiconductor material comprises a different material than the first compound semiconductor material such that the first compound semiconductor material has a two-dimensional electron gas (2DEG). The semiconductor device further includes a buried field plate disposed in the first compound semiconductor material and electrically connected to a terminal of the semiconductor device. The 2DEG is interposed between the buried field plate and the second compound semiconductor material.

16 Claims, 11 Drawing Sheets

(51) Int. Cl.
 *H01L 29/423* (2006.01)
 *H01L 29/66* (2006.01)
 *H01L 29/20* (2006.01)
 *H01L 29/06* (2006.01)

(56) References Cited

U.S. PATENT DOCUMENTS

| | | | |
|---|---|---|---|
| 2007/0235775 A1* | 10/2007 | Wu | H01L 29/402 257/288 |
| 2008/0128752 A1* | 6/2008 | Wu | H01L 29/402 257/194 |
| 2009/0065810 A1 | 3/2009 | Honea et al. | |
| 2009/0146186 A1 | 6/2009 | Kub et al. | |
| 2010/0025730 A1* | 2/2010 | Heikman | H01L 29/7787 257/194 |
| 2010/0264462 A1 | 10/2010 | Hirler et al. | |
| 2011/0095336 A1* | 4/2011 | Zundel | H01L 29/404 257/194 |
| 2012/0261720 A1* | 10/2012 | Puglisi | H01L 29/66462 257/194 |
| 2013/0153967 A1 | 6/2013 | Curatola et al. | |

FOREIGN PATENT DOCUMENTS

| | | |
|---|---|---|
| JP | 10125698 H | 5/1998 |
| JP | 2007103451 A | 4/2007 |
| JP | 2008135575 A | 6/2008 |
| JP | 2011238701 A | 11/2011 |

* cited by examiner

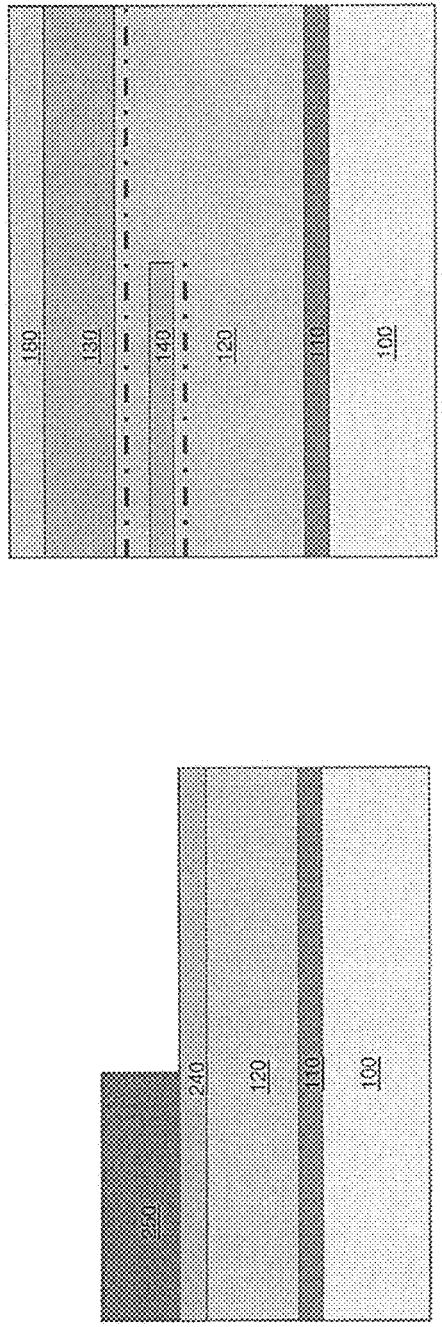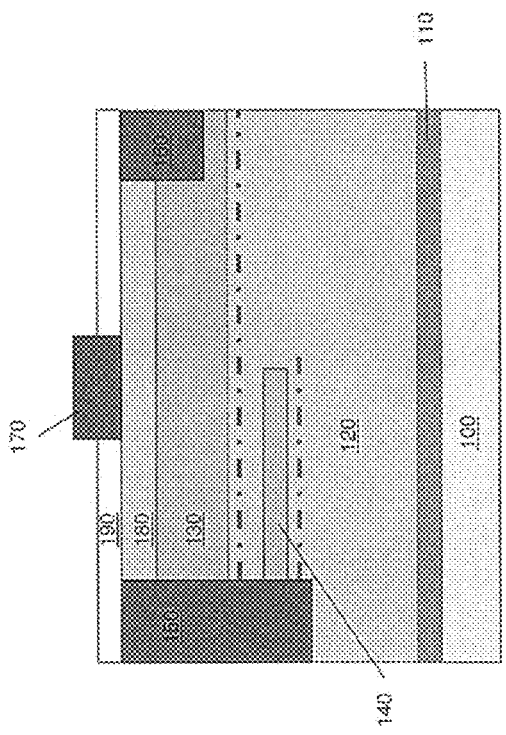
Figure 5A
Figure 5B
Figure 5C

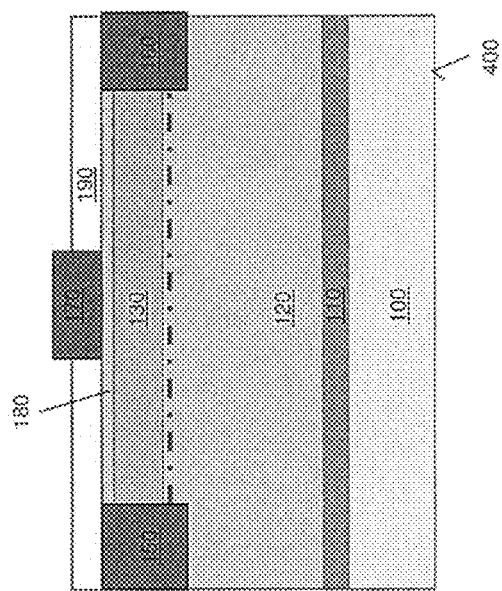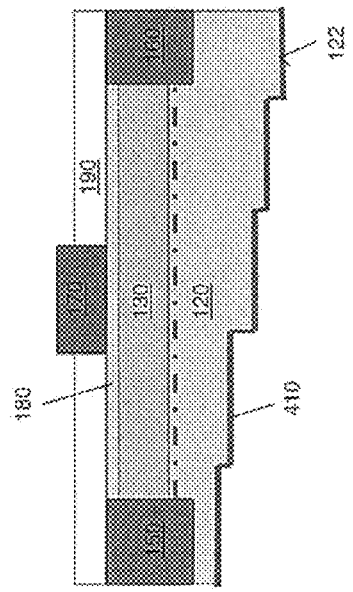
Figure 11A
Figure 11B

COMPOUND SEMICONDUCTOR DEVICE

TECHNICAL FIELD

The present application relates to compound semiconductor devices, in particular buried field plates for compound semiconductor devices.

BACKGROUND

MESFETs (metal semiconductor field effect transistors) include a conducting channel positioned between source and drain regions. Carrier flow from the source to drain is controlled by a Schottky metal gate. The channel is controlled by varying the depletion layer width below the metal contact which modulates the thickness of the conducting channel and thereby the current. Current power transistors based on GaN are constructed mostly as HEMTs (high electron mobility transistors) which are also known as heterostructure FETs (HFETs) or modulation-doped FETs (MODFETs). An HEMT is a field effect transistor with a junction between two materials having different band gaps such as GaN and AlGaN which forms the channel instead of a doped region such as in a MOSFET (metal oxide semiconductor field effect transistor). HEMTs provide a two-dimensional electron gas (2DEG) which is formed on the boundary between e.g. an AlGaN barrier layer and a GaN buffer layer. Without further measures, such a construction leads to a self-conducting i.e. normally on transistor. That is, the HEMT conducts in the absence of a positive gate voltage.

Conventional normally-on GaN HEMTs typically make use of a top field plate connected to the source terminal in order to lower the electric field peaks within the device, which in turn increases the breakdown voltage of the device. The top metal field plate is disposed above the gate electrode and insulated from the gate electrode by a dielectric material. The top metal field plate not only affects the electric field distribution in a GaN HEMT device, but also deeply impacts the AC behaviour of the device. Indeed, the main capacitance of the transistor can be modified and the switching performance of the transistor affected accordingly. The top metal field plate can also alleviate current 'collapse' which typically arises due to high concentrations of traps/defects present in GaN-based devices that induce large variation in the current drive capability of the transistor during switching cycles, by lowering the horizontal and vertical electric fields and reducing, as a consequence, the field-related trapping and de-trapping mechanisms. It is desirable to have a more efficient field plate which increases the breakdown strength of a GaN HEMT by shaping the electric field in such a way to lower the maximum electric field peaks and to enhance the breakdown strength of the device.

SUMMARY

Disclosed herein are embodiments of a buried field plate included in a compound semiconductor device such as an HEMT. The buried field plate is disposed under the channel of the device and helps shape the electric field in such a way to lower the maximum electric field peaks and enhance the breakdown strength of the device.

According to an embodiment of a semiconductor device, the device includes a first compound semiconductor material and a second compound semiconductor material on the first compound semiconductor material. The second compound semiconductor material comprises a different material than the first compound semiconductor material such that the first compound semiconductor material has a two-dimensional electron gas (2DEG). The semiconductor device further includes a buried field plate disposed in the first compound semiconductor material and electrically connected to a terminal of the semiconductor device. The 2DEG is interposed between the buried field plate and the second compound semiconductor material.

According to another embodiment of a semiconductor device, the device includes a first III-V semiconductor material and a second III-V semiconductor material on the first III-V semiconductor material. The second III-V semiconductor material comprises a different material than the first III-V semiconductor material such that the first III-V semiconductor material has a 2DEG. The device further includes a gate region on the second III-V semiconductor material with the second III-V semiconductor material interposed between the 2DEG and the gate region, a source region extending through the second III-V semiconductor material to the first III-V semiconductor material, and a drain region extending through the second III-V semiconductor material to the first III-V semiconductor material and spaced apart from the source region. The device also includes a metallization on a side of the first III-V semiconductor material facing away from the second III-V semiconductor material. The first III-V semiconductor material has a thickness which increases in a direction extending laterally from the source region to the drain region.

According to an embodiment of a method of manufacturing a semiconductor device, the method includes: forming a first compound semiconductor material on a semiconductor substrate; forming a second compound semiconductor material on the first compound semiconductor material, the second compound semiconductor material comprising a different material than the first compound semiconductor material such that the first compound semiconductor material has a two-dimensional electron gas (2DEG); forming a buried field plate in the first compound semiconductor material so that the 2DEG is interposed between the buried field plate and the second compound semiconductor material; and electrically connecting the buried field plate to a terminal of the semiconductor device.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 5A to 5C illustrate cross-sectional views of still another embodiment of a method of manufacturing a compound semiconductor device having a buried field plate.

FIGS. 11A and 11B illustrate cross-sectional views of an embodiment of a method of manufacturing a compound semiconductor device having a buffer region with a variable thickness and a metallization formed on the backside of the buffer region.

DETAILED DESCRIPTION

Figure 1:
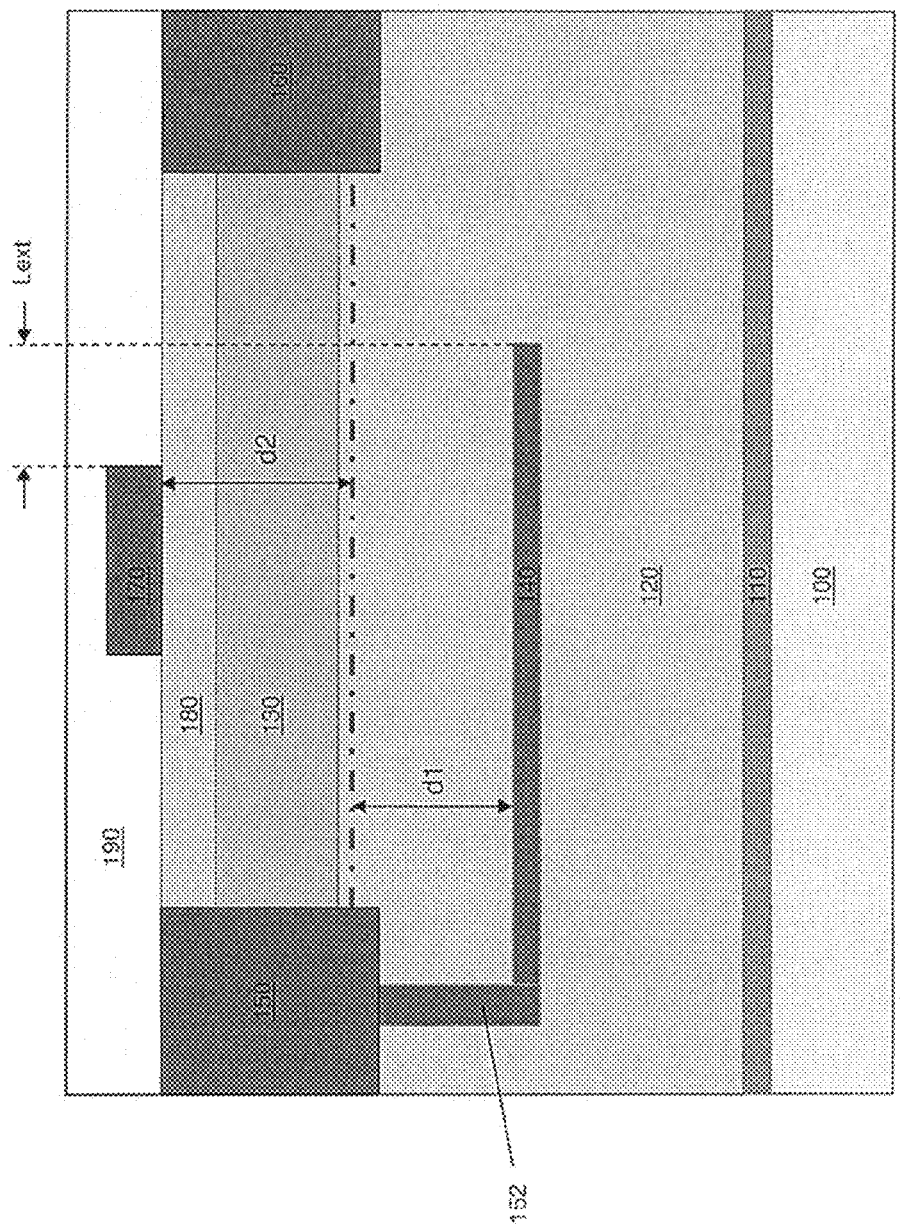
FIG. 1 illustrates a cross-sectional view of an embodiment of a compound semiconductor device having a buried field plate.

FIG. 1 illustrates an embodiment of a compound semiconductor device. According to this embodiment, the semiconductor device is a high electron mobility transistor (HEMT), also commonly referred to as a heterostructure FET (HFET) or modulation-doped FET (MODFET). The semiconductor device is manufactured on a semiconductor substrate 100 such as a Si or SiC substrate, and includes a nucleation (seed) layer 110 such as an AlN layer for providing thermal and lattice matching to the substrate 100. A compound semiconductor material 120 also referred to herein as a buffer region, is disposed on the nucleation layer 110. Another compound semiconductor material 130 also referred to herein as a barrier region, is disposed on the buffer region 120. The barrier region 130 comprises a different material than the buffer region 120 such that the buffer region 120 has a two-dimensional electron gas (2DEG) which is illustrated in FIG. 1 by the dashed and dotted line. In one embodiment, the buffer region 120 comprises GaN and the barrier region 130 comprises AlGaN. Other combinations of III-V semiconductor materials can be used in order to form a 2DEG in the buffer region 120.

The semiconductor device shown in FIG. 1 further includes a buried field plate 140 in the buffer region 120. The buried field plate 140 is electrically connected to a terminal of the semiconductor device, with the 2DEG interposed between the buried field plate 140 and the barrier region 130. In this embodiment, the terminal electrically connected to the buried field plate 140 is the source region 150 of the transistor. The source region 150 extends through the barrier region 130 into the buffer region 120 and in electrical contact with the buried field plate 140. The electrical connection between the source region 150 and buried field plate 140 is illustrated as a plug 152 in FIG. 1, but can be formed in various ways as explained in more detail later herein.

The drain region 160 of the transistor similarly extends through the barrier region 130 into the buffer region 120 and is spaced apart from the source region 150 and buried field plate 140. A gate region 170 is disposed over the 2DEG on a cap layer 180 such as a GaN cap layer, and a dielectric layer 190 is formed over the gate region 170 and cap layer 180. The 2DEG provides a channel between the source and drain regions 150, 160 which is controlled by a voltage applied to the gate region 170. The buried field plate 140 is disposed underneath the 2DEG and helps shape the electric field in such a way to lower the maximum electric field peaks and enhance the breakdown strength of the device. In one embodiment, the buried field plate 140 extends laterally further toward the drain region 160 than the gate region 170 as indicated by the distance labeled text' in FIG. 1. The cap layer 180 can be used to reduce the total leakage current and improve the passivation scheme, but may be omitted in principle.

Figure 2A:
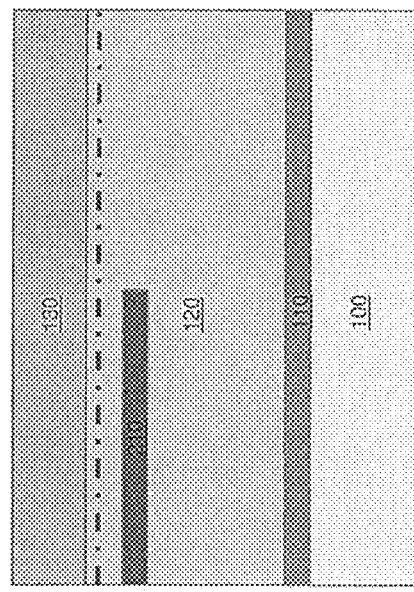
FIGS. 2A to 2C illustrate cross-sectional views of an embodiment of a method of manufacturing a compound semiconductor device having a buried field plate.
Figure 2B:
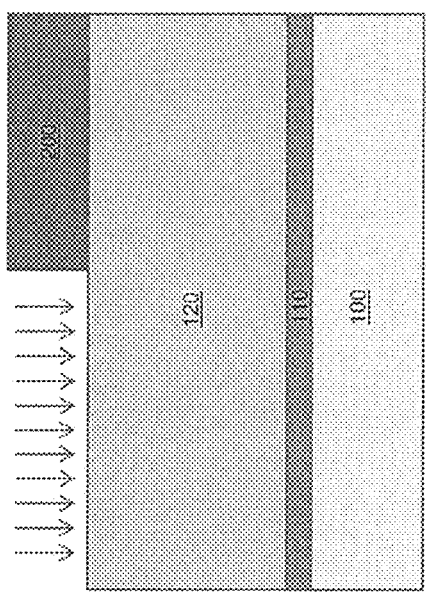
Figure 2C:
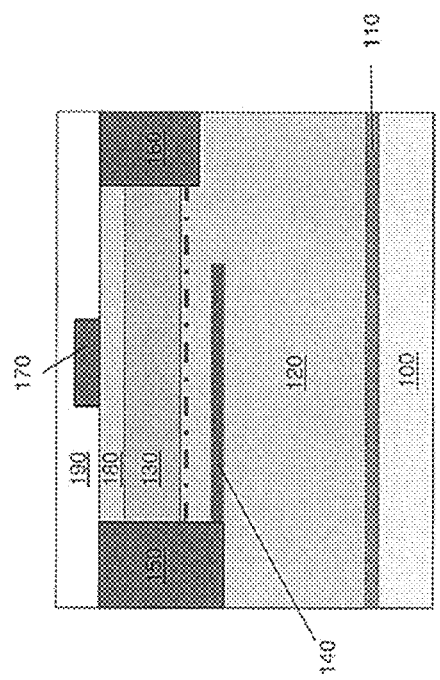

FIGS. 2A to 2C illustrate one embodiment of a method of manufacturing a compound semiconductor device having a buried field plate. According to this embodiment, the nucleation layer 110 is formed on the substrate 100 and the buffer region 120 is epitaxially grown on the nucleation layer 110. A mask 200 is formed on the buffer region 120 before the barrier region 130 is formed so that part of the buffer region 120 is exposed. A dopant species is implanted into buffer region 120 through the exposed surface to form a concentration of dopant species 210 at a depth in the buffer region 120. Multiple implants can be performed e.g. with different energy and dose of implanted species. The dopant implantation process is indicated by a series of downward facing arrows in FIG. 2A.

The barrier region 130 is then epitaxially grown on the buffer region 120 after implantation of the dopant species and removal of the mask 200 as shown in FIG. 2B. Due to polarization effects, a 2DEG arises in the buffer region 120 when the barrier region 120 is formed on the buffer region 120. The 2DEG is interposed between the barrier region 130 and the concentration of dopant species 210 in the buffer region 120. The cap layer 180, and source, drain and gate regions 150, 160, 170 of the device are then formed as is well known in the art as shown in FIG. 2C. A dielectric layer 190 can also be formed on the gate region 170 and cap layer 180.

During processing of the semiconductor device, the device is annealed which causes the concentration of dopant species 210 at a depth in the buffer region 120 to activate and form the buried field plate 140. The 2DEG is interposed between the buried field plate 140 and the barrier region 130, and the buried field plate 140 is electrically connected to the source region 150 of the device according to this embodiment as shown in FIG. 2C. According to this embodiment the buried field plate 140 is formed from a more highly doped region of the buffer region 120 and surrounded by a less highly doped region of the buffer region 120 and in contact with the source region 150 which extends down to the field plate 140. N-type or p-type dopant species can be used to form the buried field plate 140. The electrical connection between the source region 150 and the buried field plate 140 instead can be formed by a conductive plug e.g. as shown in FIG. 1.

Figure 3A:
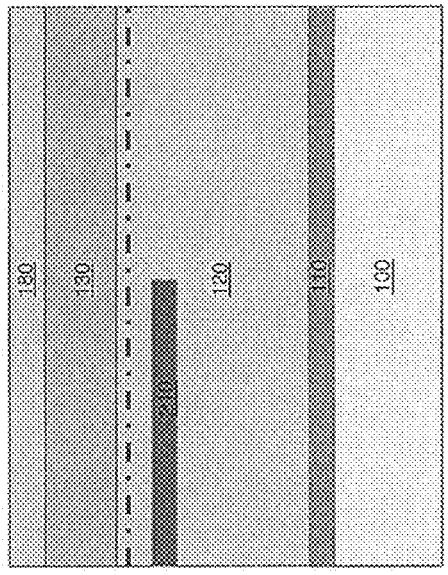
FIGS. 3A to 3C illustrate cross-sectional views of another embodiment of a method of manufacturing a compound semiconductor device having a buried field plate.
Figure 3B:
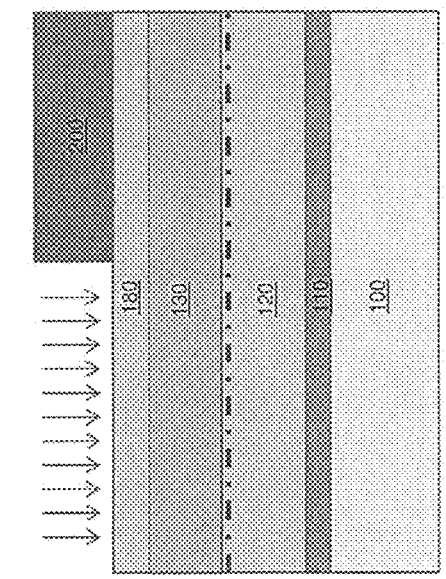
Figure 3C:
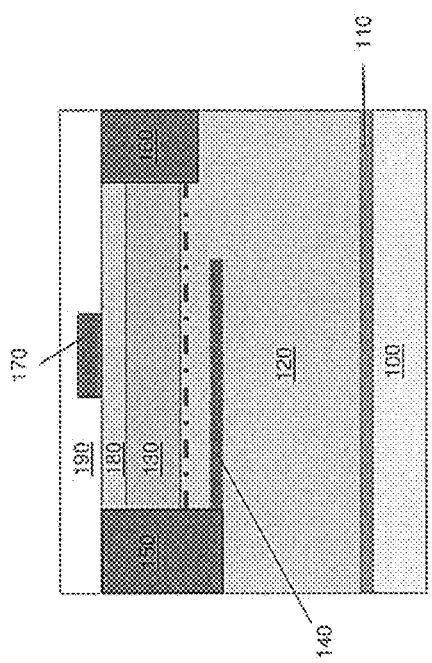

FIGS. 3A to 3C illustrate another embodiment of a method of manufacturing a compound semiconductor device having a buried field plate. According to this embodiment, the stack of III-V semiconductor materials employed to form the device are epitaxially grown one above the other on the underlying substrate 100. That is the nucleation layer 110 is epitaxially grown on the substrate 100, the buffer region 120 is epitaxially grown on the nucleation layer 110, the barrier region 130 is epitaxially grown on the buffer region 120 and the cap layer 180 is epitaxially grown on the barrier region 130 as is well known in the art and as shown in FIG. 3A. A mask 200 is then formed on the cap layer 180 so that part of the barrier region 130 is uncovered by the mask 200. A dopant species is implanted into buffer region 120 through the uncovered part of the barrier region 130 to form a concentration of dopant species 210 at a depth in the buffer region 120. The dopant implantation process is indicated by a series of downward facing arrows in FIG. 3A. As with the prior embodiment, multiple implants can be performed e.g. with different energy and dose of implanted species.

FIG. 3B shows the device after the implantation process and removal of the mask 200. The device is annealed during processing which causes the concentration of dopant species 210 to activate and form the buried field plate 140. The 2DEG is interposed between the buried field plate 140 and the barrier region 130. According to this embodiment, the buried field plate 140 is formed from a more highly doped region of the buffer region 130 and surrounded by a less highly doped region of the buffer region 130. N-type or p-type dopant species can be used to form the buried field plate 140. The source, drain and gate regions 150, 160, 170 of the device are formed as is well known in the art and as shown in FIG. 3C. A dielectric layer 190 can also be formed on the gate region 170 and cap layer 180. The source region 150 extends down to the buried field plate 140 according to this embodiment in order to form an electrical connection with the buried field plate 140. As with the prior embodiment, the electrical connection to the buried field plate 140 instead can be formed by a conductive plug e.g. as shown in FIG. 1.

Alternatively the buried field plate 140 can be formed in the buffer region 120 by implanting the dopant species through the side of the buffer region 120 facing away from the barrier region 130 instead of the side of the buffer region 120 adjacent the barrier region 130. For example, the substrate 100 can be removed so that a side of the buffer region 120 is uncovered by the substrate 100 and the dopant species are implanted through the uncovered side of the buffer region 120. In either case, the buried field plate 140 is spaced a first distance d1 from the 2DEG and the gate region 170 is spaced a second distance d2 from the 2DEG as shown in FIG. 1. In one embodiment, d1>d2.

Figure 4A:
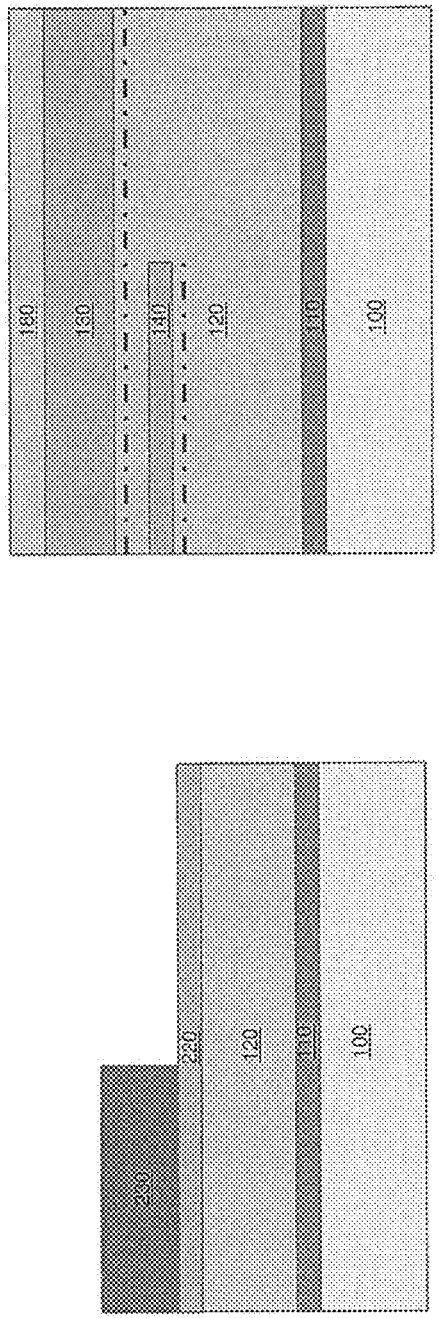
FIGS. 4A to 4C illustrate cross-sectional views of yet another embodiment of a method of manufacturing a compound semiconductor device having a buried field plate.
Figure 4B:
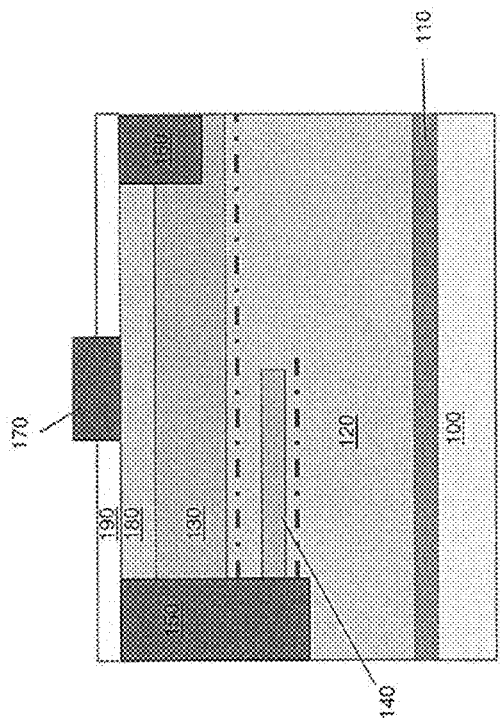
Figure 4C:
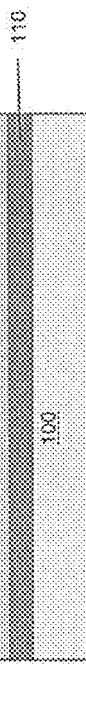

FIGS. 4A to 4C illustrate yet another embodiment of a method of a compound semiconductor device having a buried field plate. According to this embodiment, the buried field plate 140 is made of the same material as the barrier region 130 so that a second 2DEG arises in the buffer region 120. The second (lower) 2DEG is spaced further apart from the barrier region 130 than the first (upper) 2DEG, and the buried field plate 140 is interposed between the upper and lower 2DEGs. The upper 2DEG extends laterally from the source region 150 to the drain region 160 and forms a channel of the semiconductor device as shown in FIG. 4C. The lower 2DEG extends laterally from the source region 150 toward the drain region 160, but terminates before reaching the drain region 160 and behaves as a buried field plate. According to this embodiment, the lower 2DEG is formed by growing the nucleation layer 110 on the substrate 100, epitaxially growing a lower part of the buffer region 120 grown on the nucleation layer 110 and epitaxially growing an intermediary III-V semiconductor material 220 on the partial grown buffer region 120 as shown in FIG. 4A. The intermediary III-V semiconductor material 220 is of the same material as the barrier region 130 e.g. AlGaN.

A mask 230 is formed on the intermediary III-V semiconductor material 220 before the barrier region 130 is formed so that part of the intermediary material 220 is exposed as shown in FIG. 4A. The exposed (unmasked) part of the intermediary III-V semiconductor material 220 is removed e.g. via an etching process so that the underlying buffer region 120 is exposed in the area of no mask. The remaining part of the intermediary III-V semiconductor material 220 forms the buried field plate 140 according to this embodiment, and causes a 2DEG to arise in the underlying part of the buffer region 120 as shown in FIG. 4B by the shorter (lower) dashed and dotted line. The upper part of the buffer region 120 is then epitaxially grown, followed by the barrier region 130 and cap layer 180 as is well known in the art and as shown in FIG. 4B. The source, drain and gate regions 150, 160, 170 of the device are then formed as is well known in the art and as shown in FIG. 4C. A dielectric layer 190 can also be formed on the gate region 150 and cap layer 180. The source region 150 extends down to form an electrical connection with the buried field plate 140 according to this embodiment, and the field plate comprises the same material as the barrier region 130 (e.g. AlGaN). The electrical connection to the buried field plate 140 instead can be formed by a conductive plug e.g. as shown in FIG. 1.

FIGS. 5A to 5C illustrate still another embodiment of a method of manufacturing a compound semiconductor device having a buried field plate. The embodiment illustrated in FIGS. 5A to 5C is similar to the one shown in FIGS. 4A to 4C, however the buried field plate 140 is made of a different compound semiconductor material than the buffer and barrier regions 130, 140. The material of the buried field plate 140 is selected so that a two-dimensional hole gas (2DHG) arises in the buffer region 120 instead of a 2DEG. In one embodiment, the buried field plate 140 is made of InGaN. The InGaN field plate 140 can be formed by growing the nucleation layer 110 on the substrate 100, epitaxially growing a lower part of the buffer region 120 on the nucleation layer 110 and epitaxially growing an InGaN layer 240 on the partial buffer region 120.

A mask 250 is formed on the InGaN layer 240 before the barrier region 130 is formed so that part of the InGaN layer 240 is exposed as shown in FIG. 5A. The exposed (unmasked) part of the InGaN layer 240 is removed e.g. via an etching process so that the underlying buffer region 120 is exposed in the area of no mask. The remaining part of the InGaN layer 240 forms the buried field plate 140 according to this embodiment, and causes a 2DHG to arise in the underlying part of the buffer region 120 as indicated by the second (lower) dashed and dotted line in FIG. 5B. Unlike the conducting n-channel between the source and drain regions 150, 160 provided by the upper 2DEG which is indicated by the first (upper) dashed and dotted line in FIG. 5B, the lower 2DHG is conductive because of acceptor dopants (not donor dopants). The upper part of the buffer region 120 is then epitaxially grown, followed by the barrier region 130 and cap layer 180 as is well known in the art and as shown in FIG. 5B. The 2DHG is spaced further apart from the barrier region 130 than the 2DEG, and the InGaN buried field plate 140 is interposed between the 2DEG and 2DHG. The source, drain and gate regions 150, 160, 170 of the device are then formed as is well known in the art and as shown in FIG. 5C. A dielectric layer 190 can also be formed on the gate region 170 and cap layer 180. The source region 150 extends down to form an electrical connection with the InGaN buried field plate 140 according to this embodiment. However the electrical connection to the buried field plate 140 instead can be formed by a conductive plug e.g. as shown in FIG. 1.

Figure 6A:
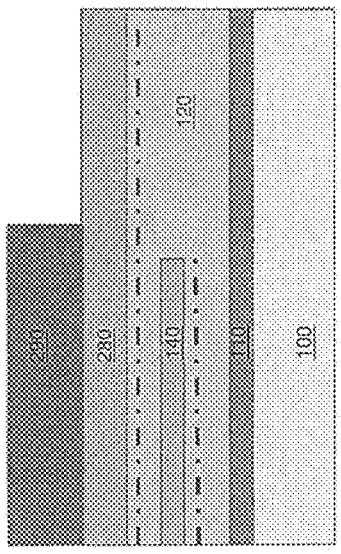
FIGS. 6A to 6C illustrate cross-sectional views of an embodiment of a method of manufacturing a compound semiconductor device having a plurality of buried field plates.
Figure 6B:
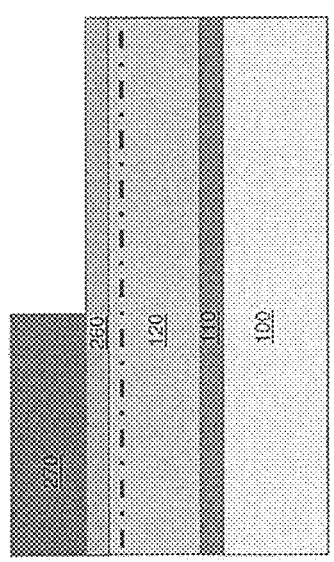
Figure 6C:
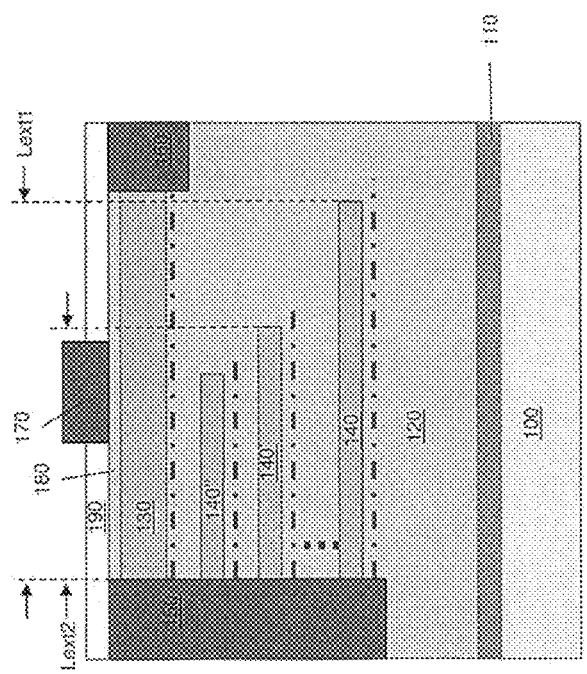

FIGS. 6A to 6C illustrate an embodiment of a method of manufacturing a semiconductor device having a plurality of buried field plates 140. In FIG. 6A, a nucleation layer 110 is formed on a substrate 100, a GaN buffer region 120 is partly epitaxially grown on the nucleation layer 110 and a first AlGaN layer 260 is epitaxially grown on the GaN region 120. A mask 270 is formed on the first AlGaN layer 260. The exposed (unmasked) part of the first AlGaN layer 260 is removed e.g. via an etching process so that the underlying GaN buffer region 120 is exposed in the area of no mask. The part of the first AlGaN layer 260 which remains after etching forms the lowermost buried field plate 140 according to this embodiment, and causes a lowermost 2DEG to arise in the underlying part of the GaN buffer region 120 as indicated by the dashed and dotted line in FIG. 6A.

In FIG. 6B, the mask is removed, more of the GaN buffer region 120 is epitaxially grown followed by a second AlGaN layer 280. A new mask 290 is then formed on the second AlGaN layer 280, and the exposed (unmasked) part of the second AlGaN layer 280 is removed e.g. via an etching process so that the underlying GaN buffer region 120 is exposed in the area of no mask. The part of the second AlGaN layer 280 which remains after etching forms another buried field plate 140' according to this embodiment, and causes another 2DEG to arise in the underlying part of the GaN buffer region 120 as indicated by the uppermost dashed and dotted line in FIG. 6A. These steps can be repeated any desired number of times to form a plurality of buried field plates 140 in the GaN buffer region 120 as shown in FIG. 6C. The remainder of the buffer region 120 and the barrier region 130 and cap layer 180 are epitaxially grown after all field plates 140 are formed, and the source, drain and gate regions 150, 160, 170 of the device are also formed as is well known in the art and as shown in FIG. 6C. A dielectric layer 190 can also be formed on the gate region 170 and cap layer 180.

Each buried field plate 140 is in contact with a terminal of the semiconductor device e.g. the source region 150, and adjacent ones of the buried field plates 140 are spaced apart from one another by a portion of the GaN buffer region 120 as shown in FIG. 6C. If the buried field plates 140 are connected to the source region 150, the source region 150 may extend deeper into the buffer region 120 than the drain region 160 as shown in FIG. 6C to form an electrical connection to the buried field plates 140. The deepest buried field 140 laterally extends further from the source region 150 toward the drain region 160 than shallower ones of the buried field plates 140', 140" as indicated by the distances labeled 'Lext1' and 'Lext2' in FIG. 6C. In addition or alternatively, any one of the buried field plates 140 can be formed from a compound semiconductor material such as InGaN which causes a 2DHG to arise in the GaN buffer region 120 instead of a 2DEG e.g. as previously explained herein with reference to FIGS. 5A to 5C.

Figure 7:
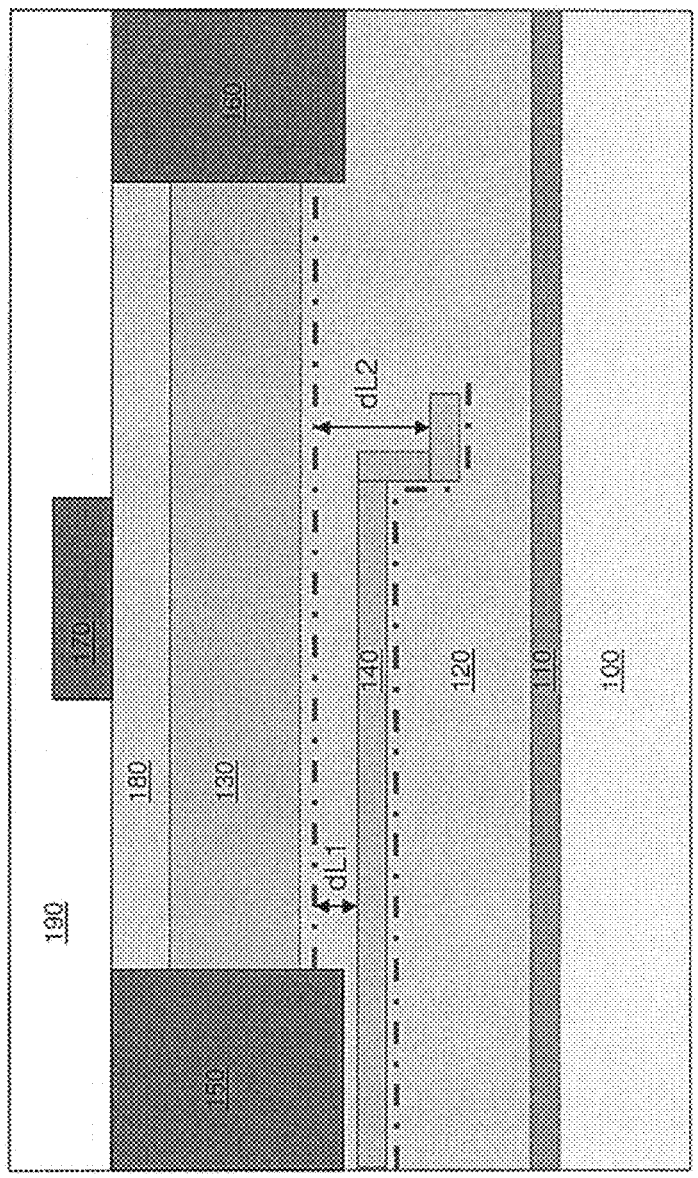
FIG. 7 illustrates a cross-sectional view of another embodiment of a compound semiconductor device having a buried field plate.

FIG. 7 illustrates another embodiment of a semiconductor device having a buried field plate 140. According to this embodiment, the distance between the buried field plate 140 and the overlying 2DEG which forms the channel of the device increases in a direction laterally extending from the source region 150 toward the drain region 160. For example, in FIG. 7 the buried field plate 140 is shown with a step and having a shorter distance dL1 to the 2DEG closer to the source region 150 and a longer distance dL2 to the 2DEG extending further laterally from the source region 150 toward the drain region 160. The buried field plate 140 may comprise a doped section of the buffer region 120 e.g. as previously described herein with reference to FIGS. 2A to 2C or FIGS. 3A to 3C. Alternatively the buried field plate 140 may be made of the same material as the barrier region 130 so that a second 2DEG arises in the buffer region 120 e.g. as previously described herein with reference to FIGS. 4A to 4C. In yet another embodiment, the buried field plate 140 may be made of a compound semiconductor material such as InGaN which causes a 2DHG to arise in the buffer region 120 instead of a 2DEG e.g. as previously described herein with reference to FIGS. 5A to 5C.

Described next are embodiments for electrically connecting a buried field plate to a terminal of a compound semiconductor device. In some embodiments the buried field plate is connected to the source region of the device. In other embodiments the buried field region is connected to a different terminal than the source region such as a terminal dedicated for field plate biasing.

Figure 8B:
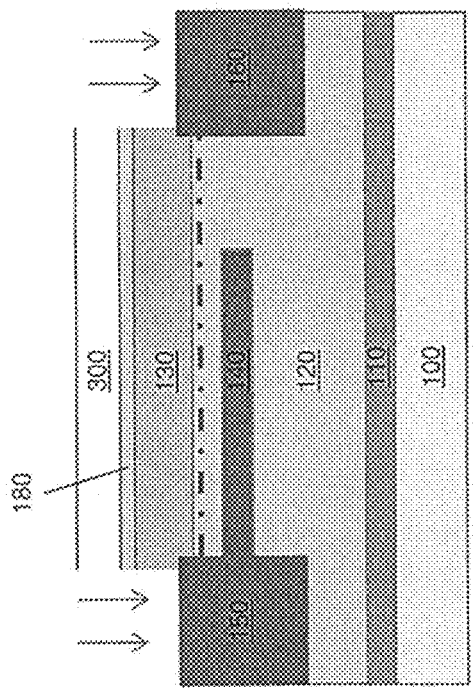
FIGS. 8A and 8B illustrate cross-sectional views of an embodiment of a method of electrically connecting a terminal of a compound semiconductor device to a buried field plate.
Figure 8A:
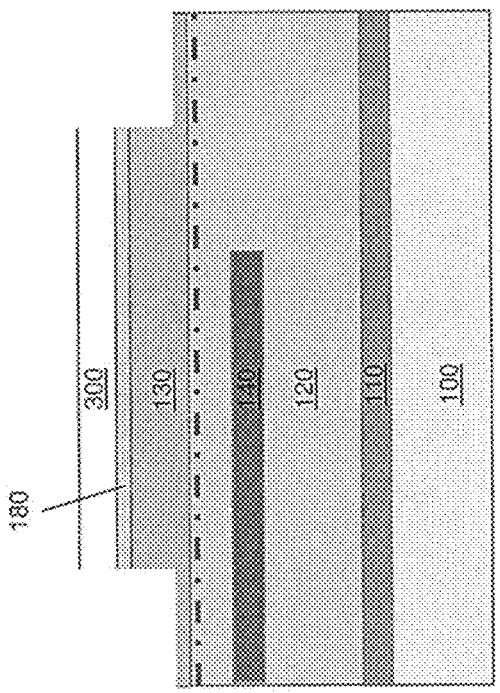

FIGS. 8A and 8B illustrate one embodiment of a method of electrically connecting a buried field plate 140 to a terminal of a compound semiconductor device. The compound semiconductor materials and buried field plate 140 of the device are formed in accordance with any of the embodiments described herein. A mask 300 is then formed on the cap layer 110, and the uncovered part of the cap layer 110 and at least a portion of the uncovered barrier region 130 are removed as shown in FIG. 8A. A dopant species is then implanted into the remaining uncovered part of the barrier region 130 and into the corresponding underlying part of the buffer region 120 as indicated by downward facing arrows in FIG. 8B. The doping process forms the source and drain regions 150, 160 of the device. The doped source region 150 contacts the buried field plate 140 and the doped drain region 160 is spaced apart from the source region 150 and the field plate 140. Multiple implants can be performed e.g. with different energy and dose of implanted species.

Figure 9B:
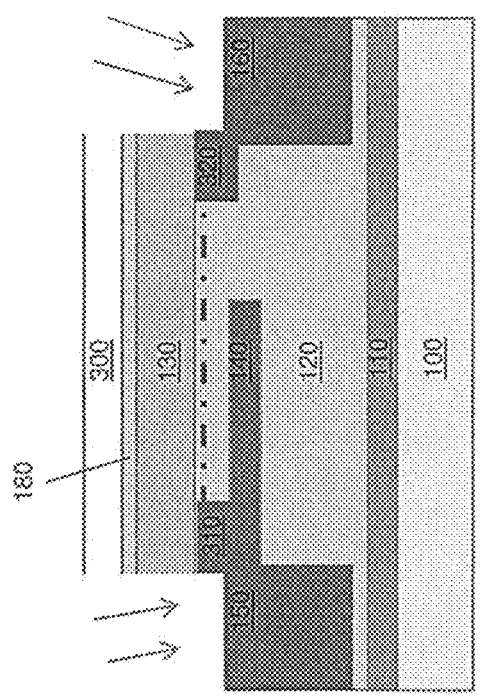
FIGS. 9A and 9B illustrate cross-sectional views of another embodiment of a method of electrically connecting a terminal of a compound semiconductor device to a buried field plate.
Figure 9A:
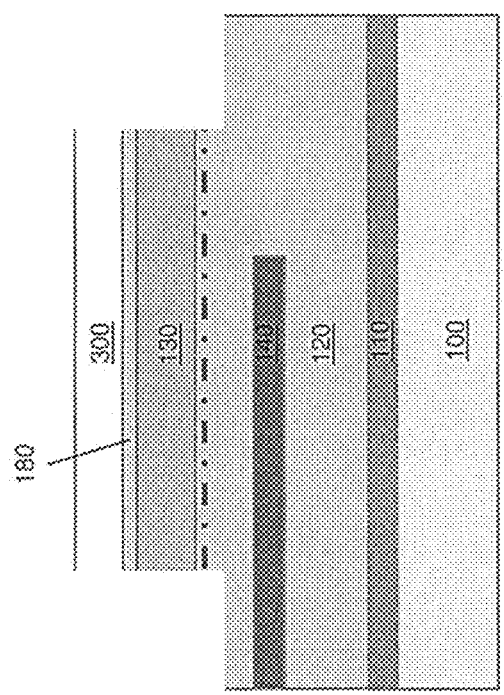

FIGS. 9A and 9B illustrate another embodiment of a method of electrically connecting a buried field plate 140 to a terminal of a compound semiconductor device. The embodiment illustrated in FIGS. 9A to 9B is similar to the one shown in FIGS. 8A to 8B, however the entire barrier region 130 uncovered by the mask 300 is removed e.g. by etching as shown in FIG. 9A. As such, the dopant species is directly implanted into the exposed part of the buffer region 120 to enhance the vertical dopant penetration as shown in FIG. 9B. Multiple implants can be performed e.g. with different energy and dose of implanted species as explained above. The dopant implantation process is indicated by a series of downward facing arrows in FIG. 9B, and may include an angled implant to form shallower source and drain regions 310, 320 under the section of the barrier region 130 protected by the mask 300.

Figure 10B:
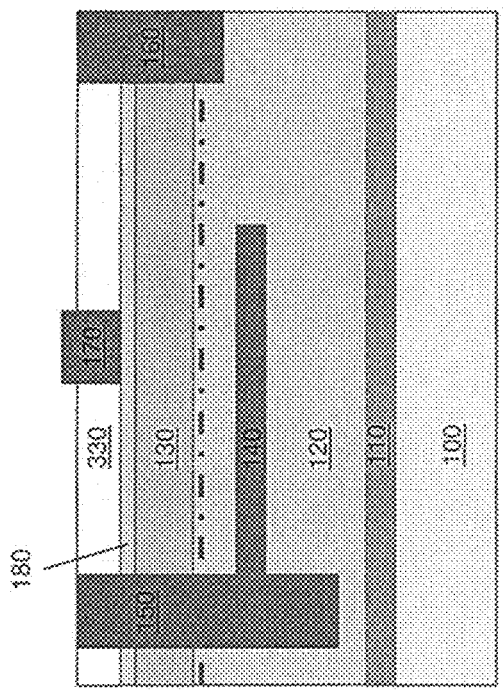
FIGS. 10A and 10B illustrate cross-sectional views of yet another embodiment of a method of electrically connecting a terminal of a compound semiconductor device to a buried field plate.
Figure 10A:
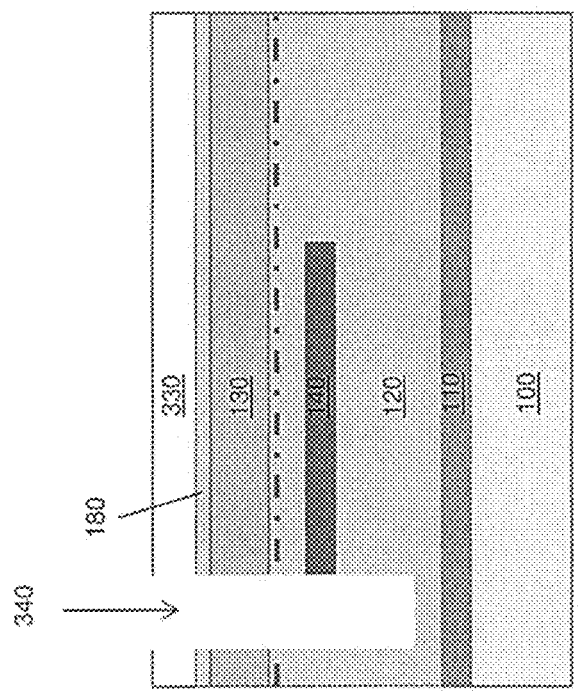

FIGS. 10A and 10B illustrate yet another embodiment of a method of electrically connecting a buried field plate 140 to a terminal of a compound semiconductor device. The compound semiconductor materials and buried field plate 140 are formed in accordance with any of the embodiments described herein. A mask 330 is then formed on the cap layer 110, a recess 340 is formed through the cap layer 110 and barrier region 130 which extends into the buffer region 120 at least to a depth of the buried field plate 140 as shown in FIG. 10A. Any conventional mask and etch processing may be used to form the recess 340. The recess 340 is then filled with an electrically conductive material such as doped polysilicon or tungsten which forms the source region 150 of the device. A side of the buried field plate 140 contacts the electrically conductive material/source 150 as shown in FIG. 10B. The drain and gate regions 160, 170 are formed as is well known in the art. The buried field plate can be electrically connected to a terminal of the compound semiconductor device using standard ohmic contacts e.g. formed by dopant implantation as previously described herein without forming a recess.

FIGS. 11A and 11B illustrate another embodiment of a method of manufacturing a compound semiconductor device. According to this embodiment, a stack of III-V semiconductor materials employed to form the device are epitaxially grown one above the other on an underlying substrate 100. For example, a III-V semiconductor nucleation layer 110 is epitaxially grown on the substrate 100, a III-V semiconductor buffer region 120 is epitaxially grown on the nucleation layer 110, a III-V semiconductor barrier region 130 is epitaxially grown on the buffer region 120 and a III-V semiconductor cap layer 180 is epitaxially grown on the barrier region 120 so that a 2DEG arises in the buffer region 120 as is well known in the art. Source, gate and drain regions 150, 160, 170 are also formed as is well known in the art. The device at this point of the process is shown in FIG. 11A.

As shown in FIG. 11B, the backside 400 of the device is then processed so that the substrate 100 and nucleation layer 110 are removed e.g. using any known conventional processing such as CMP (chemical mechanical polishing), etching, etc. Doing so exposes the backside of the buffer region 120 i.e. the side 122 of the buffer region 120 facing away from the barrier region 130. The exposed backside 122 of the buffer region 120 is etched so that the buffer region 120 has a thickness which increases in a direction extending laterally from the source region 150 toward the drain region 160 of the device. As such the buffer region 120 is thicker closer to the drain region 160 and thinner closer to the source region 150. The thickness of the buffer region 120 may gradually increase in the direction extending laterally from the source region 150 toward the drain region 160, or increase stepwise as shown in FIG. 11B or some combination thereof. In each case, a metallization 410 is provided on the side 122 of the buffer region 120 facing away from the barrier region 130.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
A first III-nitride material;
a second III-nitride_material on the first III-nitride_material, the second III-nitride material comprising a different bandgap than the first III-nitride material and wherein a two-dimensional electron gas (2DEG) extends along an interface between the first and second III-nitride materials; and
a buried field plate disposed in the first III-nitride material and electrically connected to a terminal of the semiconductor device, the 2DEG being interposed between the buried field plate and the second III-nitride material.

2. The semiconductor device of claim 1, wherein the buried field plate comprises the same material as the second III-nitride material.

3. The semiconductor device of claim 2, wherein the buried field plate and the second III-nitride material each comprise AlGaN.

4. The semiconductor device of claim 1, wherein the buried field plate comprises InGan.

5. The semiconductor device of claim 1, wherein the buried field plate comprises a more highly doped region of the first III-nitride material surrounded by a less highly doped region of the first III-nitride material.

6. The semiconductor device of claim 1, further comprising: a gate region over the 2DEG;
a source region extending through the second III-nitride material to the first III-nitride material and in contact with the buried field plate;
and a drain region extending through the second III-nitride material to the first III-nitride material and spaced apart from the source region and the buried field plate.

7. The semiconductor device of claim 6, wherein a distance between the buried field plate and the 2DEG is greater than a distance between the gate region and the 2DEG.

8. The semiconductor device of claim 6, wherein the buried field plate extends laterally from the source region toward the drain region further than the gate region.

9. The semiconductor device of claim 6, wherein the buried field plate and the source region comprise doped regions of the same doping type.

10. The semiconductor device of claim 6, further comprising at least one additional buried field plate disposed in the first III-nitride material below the 2DEG and in contact with the source region, adjacent ones of the buried field plates being spaced apart from one another by a region of the first III-nitride material.

11. The semiconductor device of claim 10, wherein the source region extends deeper into the first III-nitride material than the drain region.

12. The semiconductor device of claim 10, wherein a second one of the buried field plates is spaced further away from the second III-nitride material than a first one of the buried field plates, and laterally extends further from the source region toward the drain region than the first one of the buried field plates.

13. The semiconductor device of claim 6, wherein a distance between the buried field plate and the 2DEG increases in a direction laterally extending from the source region to the drain region.

14. The semiconductor device of claim 1, further comprising a second 2DEG in the first III-nitride material and spaced further apart from the second compound semiconductor material than the first 2DEG, and wherein the buried field plate is interposed between the first and second 2DEGs.

15. The semiconductor device of claim 14, wherein the first 2DEG extends laterally from a source region of the semiconductor device to a drain region of the semiconductor device and forms a channel of the semiconductor device, and the second 2DEG extends laterally from the source region toward the drain region and terminates before reaching the drain region.

16. The semiconductor device of claim 1, further comprising a two-dimensional hole gas (2DHG) in the first III-nitride material and spaced further apart from the second III-nitride material than the 2DEG, and wherein the buried field plate is interposed between the 2DEG and the 2DHG.

* * * * *